(12) United States Patent
Choo et al.

(10) Patent No.: US 8,969,883 B2
(45) Date of Patent: Mar. 3, 2015

(54) SEMICONDUCTOR LIGHT DEVICE AND FABRICATION METHOD THEREOF

(75) Inventors: Sung Ho Choo, Gwangju-si (KR); Ja Soon Jang, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 1144 days.

(21) Appl. No.: 10/534,489

(22) PCT Filed: Nov. 17, 2003

(86) PCT No.: PCT/KR03/02468
§ 371 (c)(1),
(2), (4) Date: May 11, 2005

(87) PCT Pub. No.: WO2004/047189
PCT Pub. Date: Jun. 3, 2004

(65) Prior Publication Data
US 2007/0029568 A1    Feb. 8, 2007

(30) Foreign Application Priority Data

Nov. 16, 2002  (KR) .................. 10-2002-0071432
Aug. 22, 2003  (KR) .................. 10-2003-0058209
Aug. 22, 2003  (KR) .................. 10-2003-0058210

(51) Int. Cl.
*H01L 33/30* (2010.01)
*H01L 33/40* (2010.01)
*H01L 33/32* (2010.01)

(52) U.S. Cl.
CPC ............... *H01L 33/40* (2013.01); *H01L 33/32* (2013.01); *Y10S 257/918* (2013.01)
USPC ........ 257/79; 257/80; 257/103; 257/E51.022; 257/E33.054; 257/918

(58) Field of Classification Search
USPC ............. 257/79, 80–103, E51.018, E51.022, 257/E33.001, E33.054, E25.032
See application file for complete search history.

(56) References Cited

U.S. PATENT DOCUMENTS 5,045,408 A  *  9/1991  Williams et al. ............. 428/620
5,670,800 A  *  9/1997  Nakao et al. .................. 257/190
(Continued)

FOREIGN PATENT DOCUMENTS

CN     1330416 A    1/2002
JP     8-32115 A    2/1996
(Continued)

OTHER PUBLICATIONS

N. A. Papanicolaou et al., "Cr/Al and Cr/Al/Ni/Au ohmic contacts to n-type GaN"; Journal of Applied Physics; vol. 87, No. 1, Jan. 1, 2000; pp. 380-386.

*Primary Examiner* — Marc Armand
(74) *Attorney, Agent, or Firm* — Birch, Stewart, Kolasch & Birch, LLP

(57) ABSTRACT

The present invention discloses a light device and a fabrication method thereof. An object of the present invention is to provide the light device and the fabrication method thereof an electric/thermal/structural stability is obtained, and a P-type electrode and an N-type electrode can be simultaneously formed. In order to achieve the above object, the inventive light device includes: a GaN-based layer; a high concentration GaN-based layer formed on the GaN-based layer; a first metal-Ga compound layer formed on the high concentration GaN-based layer; a first metal layer formed on the first metal-Ga compound layer; a third metal-Al compound layer formed on the first metal layer; and a conductive oxidation preventive layer formed on the third metal-Al compound layer.

13 Claims, 14 Drawing Sheets

(56) References Cited

U.S. PATENT DOCUMENTS

| | | | |
|---|---|---|---|
| 5,760,423 A | 6/1998 | Kamakura et al. | |
| 5,959,401 A * | 9/1999 | Asami et al. | 313/503 |
| 6,078,064 A * | 6/2000 | Ming-Jiunn et al. | 257/103 |
| 6,084,251 A * | 7/2000 | Tamamura et al. | 257/94 |
| 6,169,297 B1 | 1/2001 | Jang et al. | |
| 6,420,736 B1 | 7/2002 | Chen et al. | |
| 6,455,337 B1 * | 9/2002 | Sverdlov | 438/22 |
| 6,693,352 B1 * | 2/2004 | Huang et al. | 257/743 |
| 7,221,002 B2 | 5/2007 | Okazaki et al. | |
| 2002/0014630 A1 * | 2/2002 | Okazaki et al. | 257/79 |
| 2002/0063256 A1 * | 5/2002 | Lin | 257/79 |
| 2002/0063258 A1 * | 5/2002 | Motoki | 257/95 |
| 2002/0096687 A1 | 7/2002 | Kuo et al. | |
| 2002/0121637 A1 * | 9/2002 | Ito | 257/40 |
| 2002/0123164 A1 * | 9/2002 | Slater et al. | 438/39 |
| 2002/0126723 A1 * | 9/2002 | Ohkubo | 372/46 |
| 2002/0146856 A1 * | 10/2002 | Morita | 438/46 |
| 2003/0015708 A1 * | 1/2003 | Parikh et al. | 257/73 |
| 2003/0015721 A1 * | 1/2003 | Slater et al. | 257/99 |
| 2003/0107053 A1 * | 6/2003 | Uemura et al. | 257/200 |
| 2003/0122147 A1 * | 7/2003 | Sheu | 257/103 |
| 2004/0000670 A1 * | 1/2004 | Oh et al. | 257/76 |
| 2005/0006653 A1 | 1/2005 | Kwak et al. | |

FOREIGN PATENT DOCUMENTS

| | | | | |
|---|---|---|---|---|
| JP | 11-40853 A | | 2/1999 | |
| JP | 11-74558 A | | 3/1999 | |
| JP | 11-97744 A | | 4/1999 | |
| JP | 2000-200926 A | | 7/2000 | |
| JP | 2000-223742 A | | 8/2000 | |
| JP | 223741 | * | 11/2000 | H01L 33/00 |
| JP | 2001-015852 A | | 1/2001 | |
| JP | 2001-148508 A | | 5/2001 | |
| JP | 2005-33207 A | | 2/2005 | |
| KR | 1998-028124 A | | 7/1998 | |
| KR | 10-0226831 B1 | | 7/1999 | |
| KR | 226831 B | | 7/1999 | |
| KR | 2000-71682 A | | 11/2000 | |
| KR | 286699 B | | 1/2001 | |
| KR | 2001-14823 A | | 2/2001 | |
| KR | 2002-31683 A | | 5/2002 | |

* cited by examiner

SEMICONDUCTOR LIGHT DEVICE AND FABRICATION METHOD THEREOF

TECHNICAL FIELD

The present invention relates to a light device, and more particularly to a light device and a fabrication method thereof in which an electric/thermal/structural stability is obtained, and a P-type electrode and an N-type electrode can be simultaneously formed.

Further, the present invention relates to a light device, and more particularly to a light device and a fabrication method thereof in which a specific contact resistance is lowered, and a carrier supplied from an external can not only perform a regular current spreading using the lowered contact resistance into a device, but also a photon generated and emitted from the active layer in the device can be well escaped to the external.

Furthermore, the present invention relates to a light device, and more particularly to a light device and a fabrication method thereof in which a metal-hydrogen compound is formed to embody an ohmic electrode of a P-type gallium nitride-based compound semiconductor.

BACKGROUND ART

Generally, in order to embody a light device such as a light emitting diode or a laser, a good ohmic contact should be first of all made between a semiconductor and a metal formed as an electrode.

Further, a flatted surface state, a thermal stability, easy processing, a low contact resistance, a high yield, a good corrosion resistance and the like are required.

In the meantime, a GaN-based nitride semiconductor light emitting device is mainly grown-up on a substrate 2000. The substrate 2000 may be a sapphire substrate or a SiC substrate. Additionally, a GaN-based polycrystalline layer is grown-up as a buffer layer on the sapphire substrate or the SiC substrate at a low growing-up temperature, and then a first conductive layer 2001 (e.g., an undoped GaN layer, a silicon (Si) doped N-type GaN layer, or an N-type GaN-based layer having a combination structure thereof) is formed on the buffer layer at a high temperature. After that, a light emitting layer (quantum-well-structured active layer 2002) is formed on the first conductive layer 2001 (e.g., the N-type GaN-based layer), and a P-type GaN-based layer is additionally formed on the light emitting layer such that the semiconductor light emitting device is manufactured.

Additionally, in the semiconductor light emitting device, a transparent electrode can be formed in the following method.

First, a P-type electrode structure formed in a conventional light emitting device is briefly described with reference to FIG. 1.

FIG. 1 is a view illustrating an exemplary P-type electrode of a conventional light emitting device.

The P-type electrode of a light emitting device shown in FIG. 1 is structured to have a P-type transparent electrode layer 102 formed on a P-type GaN layer 101, and have a P-type bonding electrode 103 formed on the P-type transparent electrode layer 102. The above-structured electrode structure is called a 'close' electrode structure for convenience.

In case of the 'close' electrode structure, the P-type transparent electrode layer 102 is mainly formed of Ni/Au layer. Additionally, the P-type bonding electrode 103 is of a single layer including two or more metals (for example, Au, Ti, Ni, In and Pt) based on Au except for Al and Cr, or a multi-layer structure of two or more layers. That is, it is of an Au, Ni/Au, Ti/Au or Pt/Au layer and the like.

For example, as shown in FIG. 2, one metal is selected from the group consisting of Ni, Pt, Ti, Cr and Au to deposit a first metal layer 102a on the P-type GaN-based layer 101, and gold (Au) is used to deposit a second metal layer 102b such that the transparent electrode 102 can be formed. As a typical example of the transparent electrode, a Ni/Au electrode is used.

Or, as shown in FIG. 3, a first metal layer 102c from which oxide is well-formed is formed on the P-type GaN-based layer 101 and then, after a second metal layer 102d for carrier conduction, for example, Gold (Au) is deposited, a thermal annealing is performed in an oxygen-containing atmosphere.

As a typical example, there is a method in which after cobalt (Co) and gold (Au) are sequentially deposited on the P-type GaN-based layer 101, the thermal annealing is performed in the oxygen-containing atmosphere to form a 'Co—O' oxide. Or, a method is also proposed using nickel (Ni) instead of cobalt (Co).

Accordingly, a metal oxide layer 102e is formed to have transparency such that the transparent electrode 102 is formed on the P-type GaN-based layer 101.

A conventional P-type electrode of the light emitting device can be also structured as shown in FIG. 4, and FIG. 4 is a view illustrating another exemplary P-type electrode of the conventional light emitting device.

The P-type electrode of the light emitting device shown in FIG. 4 is structured to have a P-type transparent electrode layer 202 formed on a P-type GaN layer 201 and have a P-type bonding electrode 203 formed on the P-type transparent electrode layer 202. At this time, the transparent electrode layer 202 is structured to have a portion of the P-type bonding electrode 203 filled therebetween.

The above-structured electrode structure is called an 'open' electrode structure for convenience.

In case of the 'open' electrode structure, a structure including a Cr or Al layer is proposed so as to improve a bonding capability, and is formed to have a similar structure with the 'close' electrode structure.

In the meantime, FIG. 5 is a view illustrating an exemplary N-type electrode of the conventional light emitting device.

The light emitting device shown in FIG. 5 is structured to have an N-type electrode layer 302 formed on an N-type GaN layer 301.

In case of the N-type electrode layer 302, proposed is a single layered electrode using Ti, Al, Au or a multi-layered electrode of two or more layers.

However, in case of the above structured P-type electrode, the specific contact resistance is much higher than 10-3 $\Omega cm^2$ due to a high resistive P-type GaN layer.

Further, it is known that in a transparent electrode structure (referring to FIG. 2), not an oxide structure, since the specific contact resistance is as much high as $10^{-2}$ $\Omega cm^2$ a 'current spreader' that is one of the most main functions of the transparent electrode does not function during the device operation.

It is known that this acts as a heat source at an interface at the time of a device operation due to a high specific contact resistance of the interface to directly cause much influence on a degradation of device reliability.

Further, it is reported that the transparent electrode structure formed by the fabrication method described with reference to FIG. 3 has the considerably improved specific contact resistance, but it is known to have a performance deteriorated in light transmittance. It is known that this is since a metal oxide is 'polycrystalline'-structured at the time of the thermal annealing in an oxygen atmosphere, not 'heteroepitaxial' structure contributable to improvement of transmittance, a number of small-sized grains existing within the transparent electrode cause absorption or scattering loss of photons emitting from the semiconductor.

Furthermore, in order to embody a good quality ohmic electrode in the above structure, the carrier should have a concentration of more than $10^{18}$ cm$^{-3}$ in a doping region in which a carrier tunneling can be made, but actually a carrier concentration of a P-type Gallium nitride-based compound semiconductor is as much low as $10^{17}$ cm$^{-3}$.

As such, the low carrier concentration causes a Schottky barrier height to increase the specific contact resistance at the interface between the metal and the semiconductor, resulting in the poor ohmic characteristics.

Further, a native oxide layer existing a surface of a P-type gallium nitride-based compound semiconductor causes a mutual reaction at the interface between the metal and the semiconductor at the time of the thermal annealing such that many drawbacks of an increase of a leakage current, a reduction of a reverse breakdown voltage, an abnormal threshold voltage characteristic and the like are caused, and as a result, the device reliability and life-time are reduced.

Furthermore, the above drawbacks occur from all of the light emitting device including the P-type electrode of the 'open' electrode structure and the 'close' electrode structure. Accordingly, the P-type electrode with a high thermal stability and a low contact resistance is so sincerely required to be developed.

Additionally, the N-type electrode having the specific contact resistance of more than $10^{-5}$ $\Omega$cm$^2$ is suitable to the light emitting device, but a Ti-based electrode is reportedly so vulnerable in view of a thermal characteristic.

Further, the conventional art has many disadvantages in view of a device production and yield since the P-type electrode and the N-type electrode are separately manufactured.

DISCLOSURE OF THE INVENTION

Accordingly, the present invention is directed to a light device and a fabrication method thereof that substantially obviate one or more of the problems due to limitations and disadvantages of the related art.

An object of the present invention is to provide a light device and a fabrication method thereof in which an electric/thermal/structural stability is obtained, and a P-type electrode and an N-type electrode can be simultaneously formed.

Another object of the present invention is to provide a light device and a fabrication method thereof in which a specific contact resistance of a transparent electrode is lowered, and a carrier supplied from an external cannot only perform a regular current spreading into a device using the lowered resistance, but also a photon generated and emitted from the device can be well-escaped to the external.

A further another object of the present invention is to provide a light device and a fabrication method thereof in which a metal-hydrogen compound layer is formed within an ohmic electrode of a P-type gallium nitride-based compound semiconductor and a native oxide layer is removed such that a low resistance, a high transmittance, a high, thermal stability can be embodied.

To achieve these and other advantages and in accordance with the purpose of the present invention, as embodied and broadly described, a light device according to an aspect of the present invention includes: a GaN-based layer; a high concentration GaN-based layer formed on the GaN-based layer; a first metal-Ga compound layer formed on the high concentration GaN-based layer; a first-metal layer formed on the first metal-Ga compound layer; a third metal-Al compound layer formed on the first metal layer; and a conductive oxidation preventive layer formed on the third metal-Al compound layer.

In another embodiment, a light device including: a GaN-based layer; a high concentration GaN-based layer formed on the GaN-based layer; a transparent electrode layer formed on the high concentration GaN-based layer; a first metal-Ga compound layer formed on the transparent electrode layer; a first metal layer formed on the first metal-Ga compound layer; a third metal-Al compound layer formed on the first metal layer; and a conductive oxidation preventive layer formed on the third metal-Al compound layer.

In a further another embodiment, a light device including: a GaN-based layer; a high concentration GaN-based layer formed on the GaN-based layer; a first metal-Ga—N compound layer formed on the high concentration GaN-based layer; a first metal layer formed on the first metal-Ga—N compound layer; a third metal-Al compound layer formed on the first metal layer; and a conductive oxidation preventive layer formed on the third metal-Al compound layer.

Further, the GaN-based layer is P-type or N-type.

In a still another embodiment, a light device having a transparent electrode, wherein the transparent electrode includes: a metal oxide layer formed of a first metal; a mixed oxide layer formed by reacting a third metal and a first metal forming the metal oxide layer; and a conductive arrangement material formed of a second metal, and arranged in a metal dot shape in the metal oxide layer and the mixed oxide layer.

In a still another embodiment, a flight device including: a semiconductor layer; a high concentration impurity metal oxide layer formed on the semiconductor layer; and a transparent electrode formed on the high concentration impurity metal oxide layer.

In a still another embodiment, a light device having an electrode structure, wherein the electrode structure includes: a GaN-based layer; a contact layer formed on an upper surface of the GaN-based layer and having a high reactivity with hydrogen; a bonding pad layer formed on an upper surface of the contact layer and having a low reactivity with oxygen; a diffusion barrier layer formed at an interface of the contact layer and the bonding pad layer; and a high concentration GaN-based layer and a metal-hydrogen compound layer formed at an interface of the contact layer and the GaN-based layer by a natural reaction and/or a thermal annealing process.

In another aspect of the present invention, a light device fabrication method including the steps of: forming a first metal layer on a first GaN-based layer and a second GaN-based layer; forming a second metal layer formed of an Al-based or (Ni—Al)-based material on the first metal layer; forming a third metal layer on the second metal layer; forming a conductive oxidation preventive layer on the third metal layer; and performing a thermal annealing for the resultant material of the preceding step such that upper regions of the first GaN-based layer and the second GaN-based layer are respectively formed of a high concentration first GaN-based layer and a high concentration second GaN-based layer, a first metal-Ga compound layer is formed on the high concentration first GaN-based layer and a first metal-Ga—N compound layer is formed on the high concentration second GaN-based layer, a first metal layer is formed on the first metal-Ga compound layer and the first metal-Ga—N compound layer, a third metal-Al compound layer is formed on the first metal layer, and a conductive oxidation preventive layer is formed on the third metal-Al compound layer.

In another embodiment, a light device fabrication method including the steps of: forming a first metal layer on a GaN-based-layer; forming a second metal layer on the first metal layer; forming a third metal layer on the second metal layer; and performing a thermal annealing for the resultant material of the preceding step in an oxygen-containing atmosphere such that an upper region of the GaN-based layer is of a high concentration GaN-based layer, the first metal layer is of a metallic oxide layer, the third metal layer reacts with a first metal forming the first metal layer to form a mixed oxide layer, the second metal layer is of a metal dot shaped conductive arrangement material within the metallic oxide layer and the mixed oxide layer.

In a further another embodiment, a light device fabrication method including the steps of: removing a native oxide layer of a GaN-based compound semiconductor; depositing a contact layer using a metal having an excellent reactivity with hydrogen; forming a bonding pad layer using a metal having a low reactivity with oxygen and forming a stable compound with the contact layer; and performing a thermal annealing.

BEST MODE FOR CARRYING OUT THE INVENTION

Hereinafter, preferred embodiments of the present invention will be described in detail with reference to accompanying drawings. Here, the same reference numbers are assigned with respect to elements consisting of one pair and each of the pair is subdivided using an English letter.

First, an electrode structure of a light emitting device proposed in the present invention will be briefly described, and a detailed description will be made for the fabrication method of the light emitting device according to the present invention.

Figure 1:
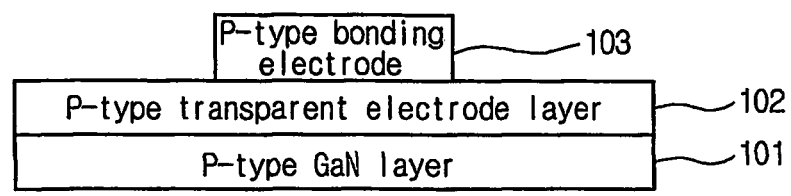
FIG. 1 is a view illustrating an exemplary P-type electrode of a conventional light emitting device.
Figure 2:
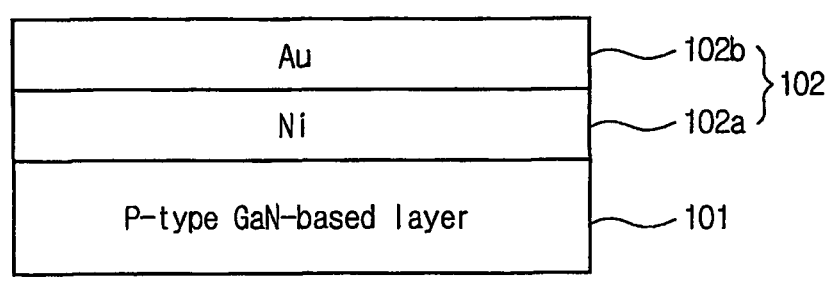
FIG. 2 is a view illustrating an exemplary multi-structured P-type electrode of a conventional light emitting device.
Figure 3:
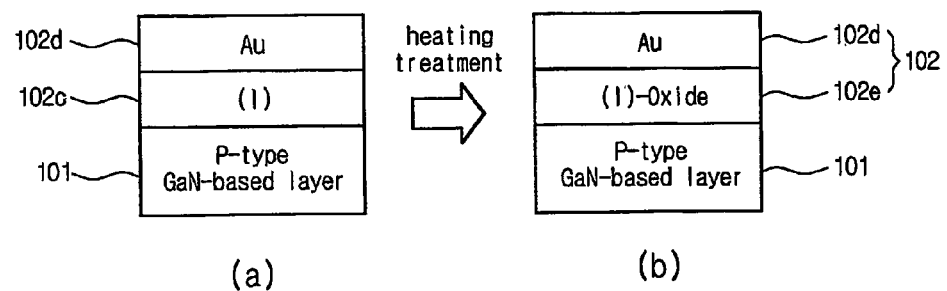
FIG. 3 is a view illustrating another exemplary multi-structured P-type electrode of a conventional light emitting device.
Figure 4:
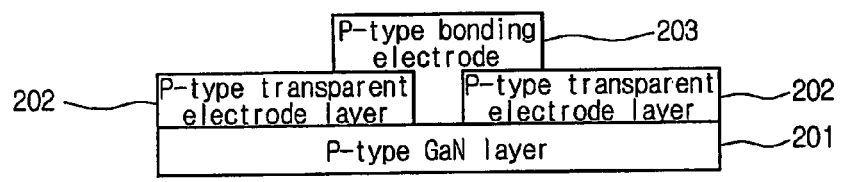
FIG. 4 is a view illustrating another exemplary P-type electrode of a conventional light emitting device.
Figure 5:
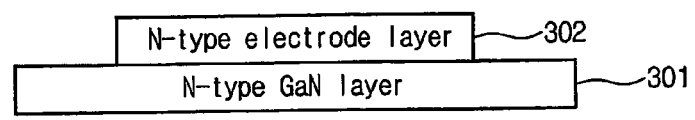
FIG. 5 is a view illustrating an exemplary N-type electrode of a conventional light emitting device.
Figure 6:
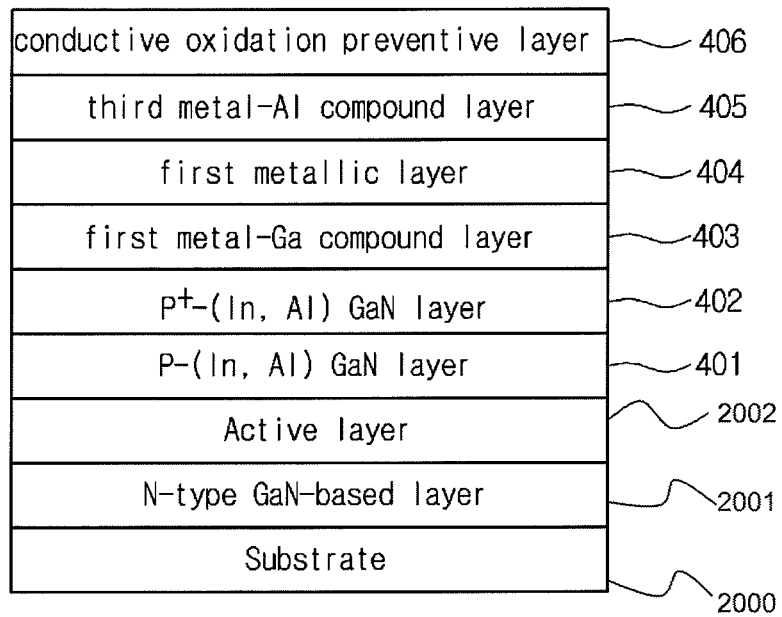
FIG. 6 is a view illustrating a P-type electrode of a light emitting device according to a first embodiment of the present invention.

FIG. 6 is a view illustrating a P-type, electrode of a light emitting device according to a first embodiment of the present invention.

As shown in FIG. 6, the inventive light emitting device has a $P^+$—(In, Al) GaN layer 402 as a high hole concentration layer formed on a P—(In, Al) GaN layer 401. Additionally, a first metal-Ga compound layer 403 is formed on the $P^+$—(In, Al) GaN layer 402, and a first metal layer 404 is formed on the first metal-Ga compound layer 403. Further, a third metal-Al compound layer 405 is formed on the first metal layer 404, and a conductive oxidation preventive layer 406 is formed on the third metal-Al compound layer 405. This represents a P-type electrode structure corresponding to a conventional 'open' electrode structure.

Figure 7:
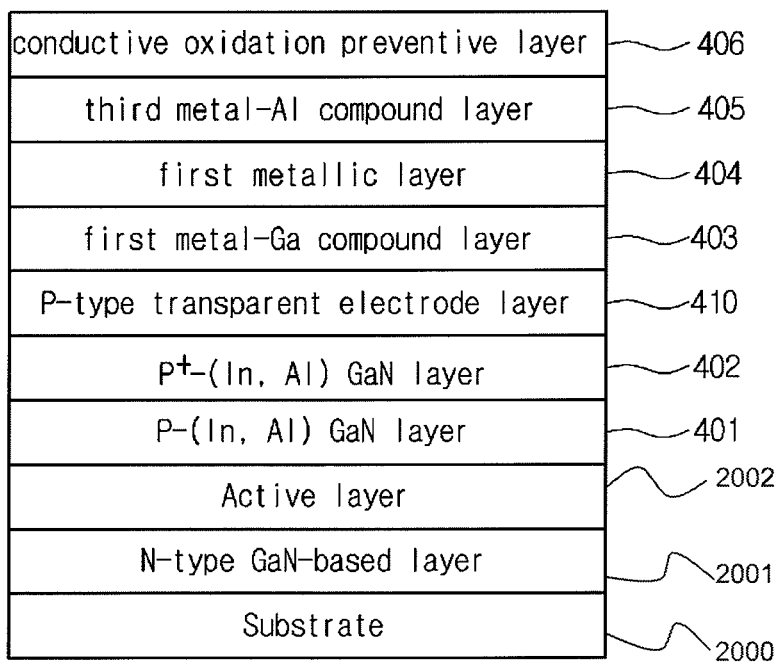
FIG. 7 is a view illustrating a P-type electrode of a light emitting device according to a second embodiment of the present invention.

FIG. 7 is a view illustrating a P-type electrode of a light emitting device according to a second embodiment of the present invention.

As shown in FIG. 7, the light emitting device according to the second embodiment of the present invention has a $P^+$—(In, Al) GaN layer 402 as a high hole concentration layer formed on a P—(In, Al) GaN layer 401, and a P-type transparent electrode layer 410 is additionally formed on the $P^+$—(In, Al) GaN layer 402.

Additionally, a first metal-Ga compound layer 403 is formed on the P-type transparent electrode layer 410, and a first metal layer 404 is formed on the first metal-Ga compound layer 403.

Further, a third metal-Al compound layer 405 is formed on the first metal layer 404, and a conductive oxidation preventive layer 406 is formed on the third metal-Al compound layer 405. This represents a P-type electrode structure corresponding to a conventional 'close' electrode structure.

Figure 8:
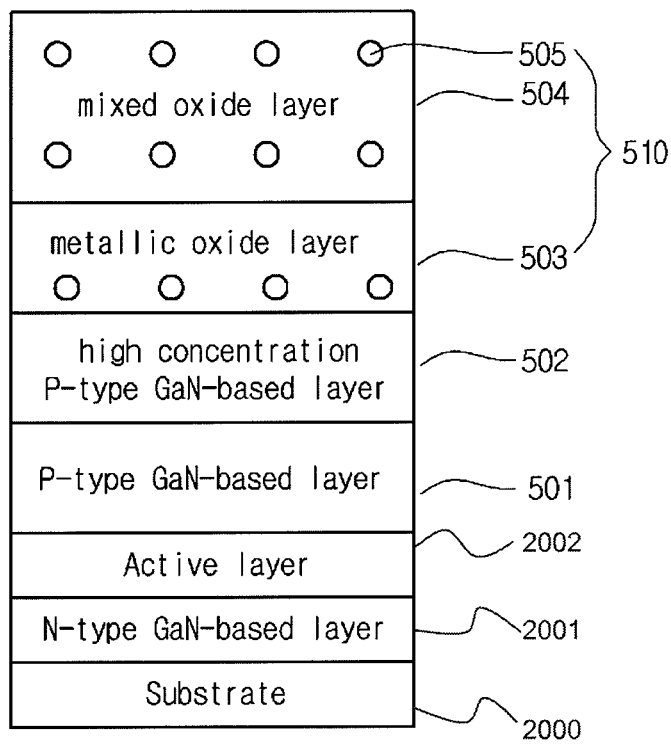
FIG. 8 is a view illustrating a structure of a light emitting device having a transparent electrode according to a third embodiment of the present invention.

FIG. 8 is a views illustrating a structure of a light emitting device having a transparent electrode according to a third embodiment of the present invention.

As shown in FIG. 8, the transparent electrode 510 of the light emitting device according to the present invention is of a metal oxide layer 503, a mixed oxide layer 504 and a conductive arrangement material 505. Additionally, the transparent electrode 510 is formed on a high concentration P-type GaN-based layer 502, and the high concentration P-type GaN-based layer 502 is formed on the P-type GaN-based layer 501.

Herein, the conductive arrangement material 505 is arranged to have a metal dot shape in the whole transparent electrode 510 comprised of the metal oxide layer 503 and the mixed oxide layer 504, and functions as a 'conductive bridge'. At this time, the conductive arrangement material 505 is arranged to have a metal dot shape with periodical arrangement within the transparent electrode 510.

Figure 9:
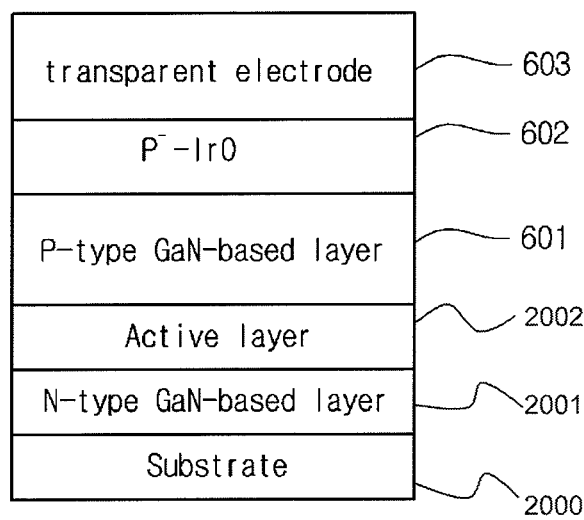
FIG. 9 is a view illustrating a structure of a light emitting device having a transparent electrode according to a fourth embodiment of the present invention.
Figure 10:
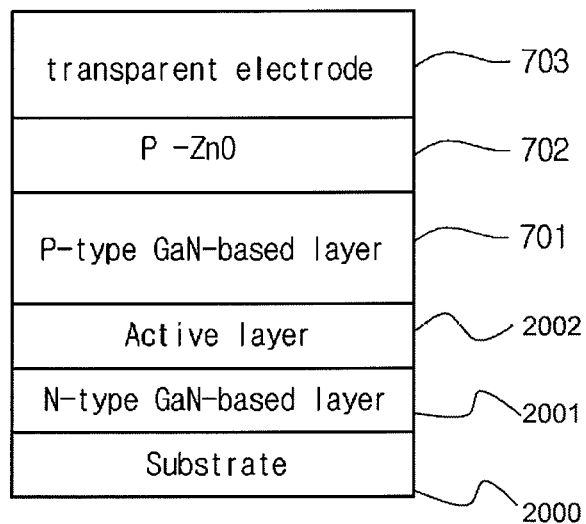
FIG. 10 is a view illustrating a structure of a light emitting device having a transparent electrode according to a fifth embodiment of the present invention.
Figure 11:
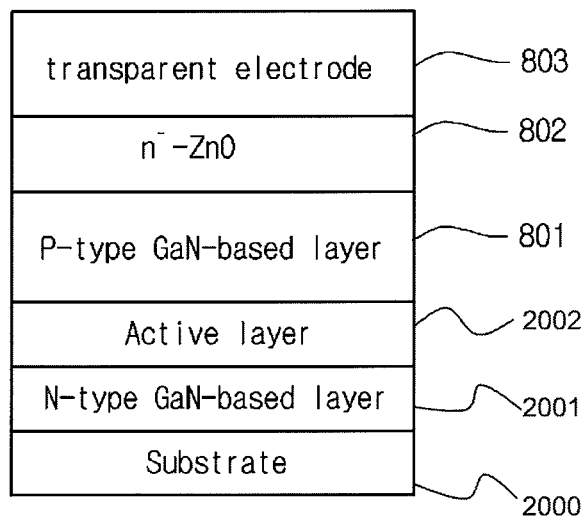
FIG. 11 is a view illustrating a structure of a light emitting device having a transparent electrode according to a sixth embodiment of the present invention.

On the other hand, as another example of the transparent electrode of the light emitting device according to the present invention, the transparent electrode of the light emitting device can be also formed as shown in FIGS. 9 to 11.

FIGS. 9 to 11 are views illustrating structures of light emitting devices having transparent electrodes according to fourth to sixth embodiments of the present invention.

As shown in FIG. 9, the transparent electrode according to the fourth embodiment of the present invention has a $P^+$—IrO layer 602 having a high hole concentration (more than $10^{18}$ cm$^{-3}$) formed on a P-type GaN-based layer 601, and a transparent electrode 603 is formed on the $P^+$—IrO layer 602. Herein, the transparent electrode 603 can be formed of a certain metallic transparent electrode (for example, Co—O/Au, Ni—O/Au and the like), and can be formed of the transparent electrode described with reference to FIG. 8.

Herein, the $P^+$—IrO layer 602 can be formed in the following methods.

One method is a deposition method using a sputtering system in which a deposition is performed using a gas plasma containing oxygen for an IrO or Ir target.

In another method, the $P^+$—IrO layer 602 can be also formed by depositing Ir by an evaporator or physical vapor deposition (PVD) method, and then performing the thermal annealing at a high temperature of at least 400° C. in an oxygen-containing atmosphere. At this time, the oxide itself has 'p-conduction'.

Additionally, as shown in FIG. 10, the transparent electrode according to the fifth embodiment of the present invention has a $P^+$—ZnO layer 702 having a high hole concentration (more than $10^{18}$ cm$^{-3}$) formed on a P-type GaN-based layer 701, and a transparent electrode 703 is formed on the $P^+$—IrO layer 702. Herein, the transparent electrode 703 can be of a metal having an excellent conductivity and light transmittance, and can be formed of the transparent electrode described with reference to FIG. 8.

Herein, as a forming method, the $P^+$—IrO layer 702 can be formed using a sputter, MBE (Molecular Bean Epitaxy), MOCVD (Metal Oxide Chemical Vapor Deposition). In this case, P is used as a dopant.

In case of the sputter, a high concentration P-type ZnO can be deposited using an oxygen-containing gas plasma and $PH_3$ for a ZnO target, and in case of the MOCVD, the high concentration P-type ZnO can be grown-up using $ZnCl_2$, $O_2$ and $PH_3$.

Further, as shown in FIG. 11, the transparent electrode according to the sixth embodiment of the present invention has a high concentration $N^+$—ZnO layer 802 formed on a P-type GaN-based layer 801, and a transparent electrode 803 is formed on the $N^+$—IrO layer 802. Herein, the transparent electrode 803 can be of a metal having an excellent conductivity and light transmittance, and can be formed of the transparent electrode described with reference to FIG. 8.

As an $N^+$—ZnO layer 802 forming method, a sputter deposition method is used, and a MOCVD deposition method is also considered.

In the method using the sputter, firstly, if ZnO, $Al_2O_3$ targets are used to form the plasma in the oxygen-containing atmosphere for deposition, Al acts as a 'N-conduction dopant' within ZnO to deposit a high concentration ZnO.

As a more exact expression of the ZnO formed as above, the ZnO is expressed as ZnO:Al or AZO (Al doped ZnO).

The above-described present invention can obtain the following characteristics.

The $P^+$-type IrO 602 or the $P^+$-type ZnO 702 having the high hole concentration (more than $10^8$ cm$^{-3}$) is formed on the P-type GaN-based layer 601 or 701 such that the transparent electrode 603 or 703 formed on the $P^+$-type IrO 602 or the $P^+$-type ZnO 702 can easily accomplish the ohmic contact by a tunneling operation principle.

That is, the IrO and ZnO having the high concentration doping function as the tunneling layer with respect to the transparent electrode layer formed thereon such that the excellent ohmic contact can be accomplished.

It is known that if the doping concentration increases, since the carrier flows by a tunneling irrespective of a metal semiconductor contact barrier, the ohmic contact is naturally formed.

Further, even in case the $N^+$-type ZnO layer 802 is formed, the ohmic contact with the transparent electrode 803 formed thereon can be accomplished by the tunneling operation principle.

Figure 12:
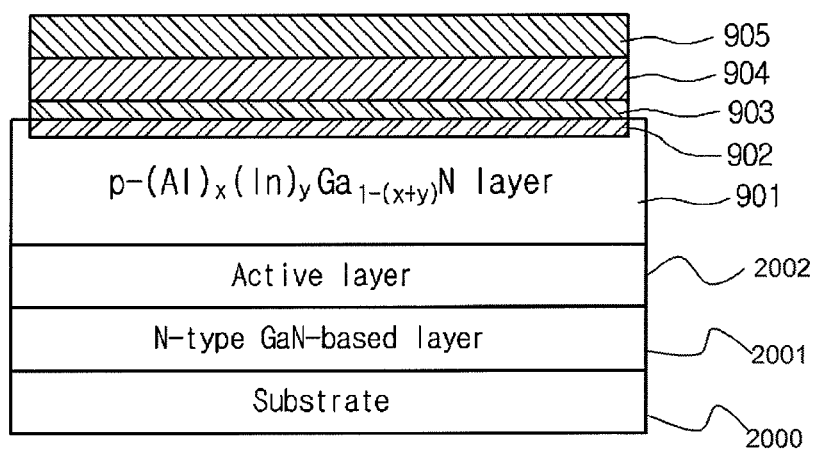
FIG. 12 is a sectional view illustrating an ohmic electrode of a P-type gallium nitride-based compound (p-$(Al)_x(In)_y(Ga)_{1-(X+Y)}N$) semiconductor having a metal-hydrogen compound layer formed before thermal annealing according to a seventh embodiment of the present invention.

FIG. 12 is a sectional view illustrating an ohmic electrode of a P-type gallium nitride-based compound (P—(Al)$_x$(In)$_y$(Ga)$_{1-(X+Y)}$N) semiconductor having a metal-hydrogen compound layer formed before a thermal annealing according to a seventh embodiment of the present invention.

Referring to FIG. 12, laminated are a P-type gallium nitride-based compound (P—(Al)$_x$(In)$_y$(Ga)$_{1-(x+y)}$N) semiconductor layer 901, a contact layer 904 and a bonding pad layer 905.

Before the contact layer 904 is formed, if a metal forming the contact layer 904 is deposited after a native oxide layer of the P-type gallium nitride-based compound (P—(Al)$_x$(In)$_y$ $(Ga)_{1-(x+y)}N)$ semiconductor is removed, the metal forming the contact layer 904 and a hydrogen within the P-type gallium nitride-based compound (P—$(Al)_x(In)_y(Ga)_{1-(x+y)}N$) semiconductor are combined to form a metal-hydrogen compound layer 903, and a P$^+$-type gallium nitride-based compound (P$^+$—$(Al)_x(In)_y(Ga)_{1-(x+y)}N$) semiconductor layer 902 on a lower surface of the metal-hydrogen compound layer 903.

The contact layer 904 can be formed of a single layer or a multi layer, and can be of platinum (Pt), titanium (Ti), palladium (Pd), nickel (Ni), tantalum (Ta), tungsten (W), aluminum (Al), chrome (Cr), vanadium (V) iridium (Ir), hafnium (Hf) and cobalt (Co).

Further, the bonding pad layer 905 can be formed of a single layer or a multi layer and can be of gold (Au), palladium (Pd), ruthenium (Ru), nickel (Ni), tungsten (W), cobalt (Co), molybdenum (Mo) and copper (Cu).

Furthermore, when assuming that an element of the bonding pad layer 905 is 'M', M-O ('M' oxygen compound), M-Si ('M' silicon compound), M-N ('M' nitrogen compound) and M-C ('M' carbon compound) can be also formed.

Furthermore, the metal-hydrogen compound layer 903 is formed such that a carrier of a P-type gallium nitride-based compound (P—$(Al)_x(In)_y(Ga)_{1-(x+y)}N$) semiconductor can be increased to lower a height of a Schottky barrier height existing at an interface of the metal and the semiconductor.

On the other hand, the native oxide layer within the P-type gallium nitride-based compound (P—$(Al)_x(In)_y(Ga)_{1-(x+y)}N$) semiconductor is removed using chemicals or a plasma source for etching. Specifically, in case the chemicals is used, passivation of an element of fluorine (F), chorine (Cl), sulfur (S), hydroxy (OH) and the like is formed on a P-type wafer to facilitate a reaction of the metal and hydrogen of the P-type wafer at the time of depositing a metal element. Preferably, as the chemicals, a BOE (Buffered Oxide Etch) solution is used.

Figure 13:
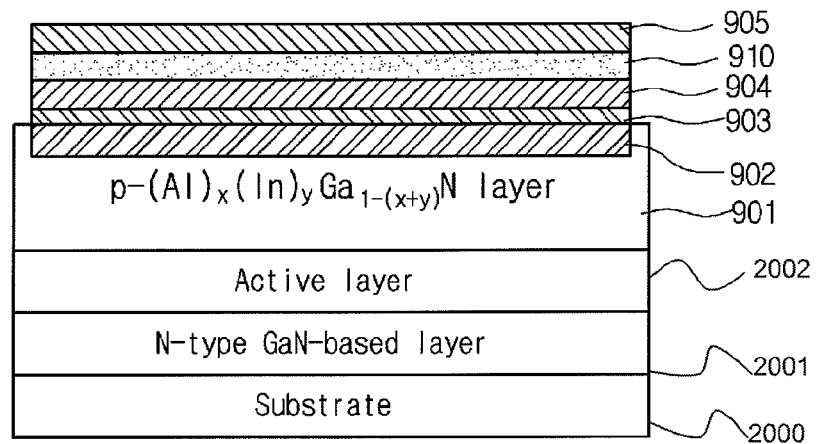
FIG. 13 is a sectional view illustrating a structure of an ohmic electrode of a P-type gallium nitride-based compound (p-$(Al)_x(In)_y(Ga)_{1-(X+Y)}N$) semiconductor after thermal annealing according to a seventh embodiment of the present invention.

FIG. 13 is a sectional view illustrating a structure of an ohmic electrode of a P$^+$-type gallium nitride-based compound (P$^+$—$(Al)_x(In)_y(Ga)_{1-(X+Y)}N$) semiconductor after thermal annealing according to a seventh embodiment of the present invention.

Referring to FIG. 13, unlike FIG. 12, a diffusion barrier layer 910 is additionally formed between the bonding pad layer 905 and the contact layer 904 by the thermal annealing, and a P$^+$-type gallium nitride-based compound (P$^+$—$(Al)_x(In)_y(Ga)_{1-(X+Y)}N$) semiconductor layer 902 and a metal-hydrogen compound layer 903 are formed more deeply.

The diffusion barrier layer 910 is formed by mutually reacting with the bonding pad layer 905 and the contact layer 904, and unwanted reaction between the metal and the semiconductor is suppressed.

Further, the thermal annealing facilitates a reaction of the contact layer 904 and a P-type gallium nitride-based compound (P—$(Al)_x(In)_y(Ga)_{1-(X+Y)}N$) semiconductor 901 such that an active reaction of the metal of the contact layer and hydrogen causes the P$^+$-type gallium nitride-based compound (P$^+$—$(Al)_x(In)_y(Ga)_{1-(X+Y)}N$) semiconductor layer 902 and the metal-hydrogen compound layer 903 to be formed more deeply to thereby more increase the carrier concentration. As a result, a more excellent ohmic electrode can be embodied.

Figure 14:
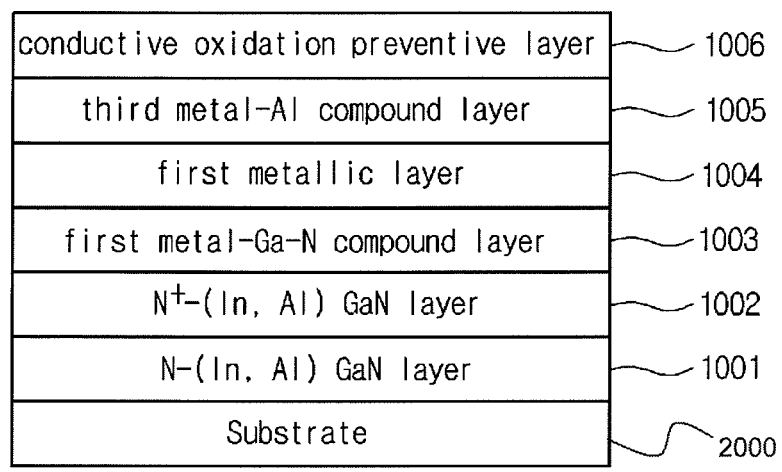
FIG. 14 is a view illustrating an exemplary N-type electrode of a light emitting device according to a preferred embodiment of the present invention.

On the other hand FIG. 14 is a view illustrating an exemplary N-type electrode of a light emitting device according to a preferred embodiment of the present invention.

In another example of the light emitting device according to the present invention, as shown in FIG. 14, an N$^+$—(In, Al) GaN layer 1002 is formed on an N—(In, Al) GaN layer 1001.

Additionally, a first metal-Ga—N compound layer 1003 is formed on the N$^+$—(In, Al) GaN layer 1002, and a first metal layer 1004 is formed on the first metal-Ga—N compound layer 1003.

Further, a third metal-Al compound layer 1005 is formed on the first metal layer 1004, and a conductive oxidation preventive layer 1006 is formed on the third metal-Al compound layer 1005.

Thus, an electrode forming procedure of the above light emitting device is described with reference to FIGS. 15 to 25.

Figure 15:
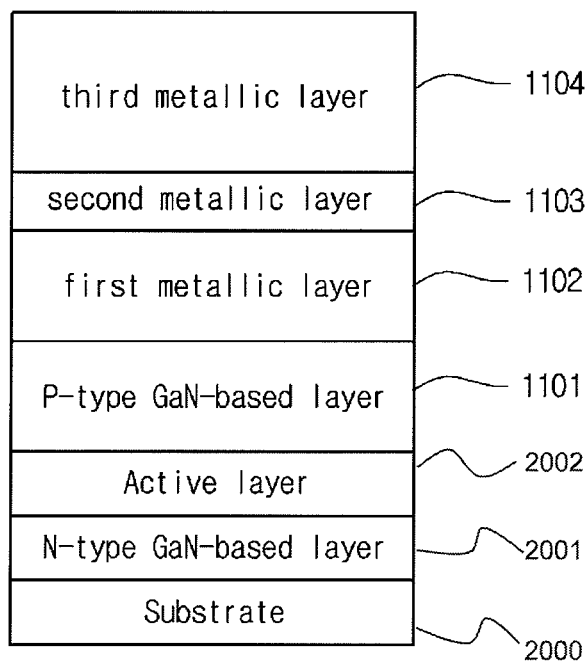
FIG. 15 is a view for depicting a fabrication method of a transparent electrode of a light emitting device according to a preferred embodiment of the present invention.

FIG. 15 is a view for depicting a fabrication method of a transparent electrode of the light emitting device according to a preferred embodiment of the present invention.

Firstly, a first metal layer 1102 is formed on a P-type GaN-based layer 1101, for example, a P—(In, Al) GaN layer on which the transparent electrode is intended to be formed. Herein, the first metal layer 1102 is of one selected from metals (particularly, metals having a low reactivity with N) having an excellent affinity with hydrogen and a low reactivity with a material forming the P-type GaN-based layer 1101, for example, GaN.

Additionally, a second metal layer 1103 is formed on the first metal layer 1102. At this time, the second metal layer 1103 is of a selected material that can easily form a metal dot shape (referring to conductive arrangement material 505 of FIG. 8) within an oxide formed later. This will be again described later.

Further, a third metal layer 1104 is additionally formed on the second metal layer 1103. Herein, the third metal layer 1104, is of a selected material that can easily form the mixed oxide layer (referring to 504 of FIG. 8) in the thermal annealing process performed later with the first metal layer 1102.

As such, as a subsequent process for the laminated result, the thermal annealing process (or plasma process) is performed in the oxygen-containing atmosphere. Accordingly, the following reaction is performed.

Firstly, a metal forming the first metal layer 1102 effectively absorbs hydrogen existing in a Mg—H complex structure existing within the P-type GaN-based layer, 1101 at the time of the oxygen-containing thermal annealing process (or plasma process). Accordingly, the first metal layer 1102 has a structure of '(first metal)-Oxide:H' (metal oxide layer 503 of FIG. 8), and at the same time, the P-type GaN-based layer 1101 is of the high concentration P-type GaN-based layer (502 of FIG. 8) and the P-type GaN-based layer (501 of FIG. 8).

Together with this, since the metal forming the first metal layer 1102 has a low reactivity with a material forming the P-type GaN-based layer 1101, for example, Gas, it is difficult to form a metal-nitride such as '(first metal)-nitride' such that a stable, ohmic electrode structure is obtained.

Additionally, the thermal annealing process causes a mutual diffusion reaction to occur at a portion of the third metal layer 1104 and the first metal layer 1102 such that a thermally stable 'mixed oxide of (third metal)-(first metal)' (504 of FIG. 8) is formed. This allows a transparent layer to be formed together with '(first metal)-Oxide:H' layer (metal oxide layer 503 of FIG. 8) to help that a light generated from within a device is well emitted from the device.

Further, a metallic material forming the second metal layer 1103 forms a 'metal dot' (referring to conductive arrangement material 505 of FIG. 8) within the oxide by the thermal annealing process. The metal dot functions as a 'conduction bridge' to cause the oxide layer formed by the thermal annealing process to have a conductivity to help that the transparent electrode 510 functions as a current spreader for spreading the current.

Together with this, since a size and a density of the metal dot is controlled to cause a refractive index within the oxide to be adjusted, a function of a photon path can be performed such that the photon can be more emitted from the device in short wavelength regions.

The above-described present invention can obtain the following characteristics.

Firstly, the metal material having an oxygen affinity and a low reactivity with the P-type GaN-based layer formed at a lower portion thereof is used as the contact layer such that a doping concentration at the P-type nitride semiconductor caused by the contact electrode layer is effectively increased after the thermal annealing process. Accordingly, a good quality ohmic contact can be embodied and an improvement for a device reliability is much expected due to a stable interface.

Further, the 'metal dot' functioning as a TCB (TCO conducting Bridge) is formed in the whole oxide such that the refractive index adjustment and the carrier conduction characteristic are easily improved. Accordingly, the loss of the photon generated from within the device is reduced that is caused by absorption or scattering at the transparent electrode layer such that a light output of the device can be remarkably increased.

Furthermore, since a dual TCO mixed oxide itself is much stable thermally, the above-constructed transparent, structure has an excellent 'current-spreader', 'photon path', 'absorption factor against interfacial energy' function in the device such that much effect can be obtained in an electric/structural/optical characteristic improvement, a reliability security and the like of the light emitting device.

On the other hand, as a concrete example of the material forming each metal layer, the following material can be selected.

First metal layer: Pd, Ir, Zn and Ni
Second metal layer: Au and Pt
Third metal layer: ZnO, IrO, Ir, Ni, Pd, Zn and V Herein, as the material forming the first metal layer, the metal is selected in which the reactivity is excellent with hydrogen while the oxide is easily formed, and the metal almost not having the reactivity with N is selected. This is because if the material forming the first metal layer reacts with N, since the doping concentration existing within the P—(In, Al) GaN layer is lowered due to a compensation phenomenon, it is difficult to form the ohmic characteristic.

Further, the material forming the second metal layer is selected from the metals that can form the metal dot.

The metal dot is formed in the following principle. That is, if the metal forming the oxide and the metal not forming the oxide are laminated and thermally annealed, the former forms the oxide, and the metal not forming the oxide is naturally in a dot shape by a strain phenomenon caused by a difference of a thermal energy with a surface. The metal dot helps that the oxide has the conductivity, and the size of the metal dot is controlled such that the refractive index of the oxide can be adjusted. At this time, the size and the density of the metal dot can be controlled by varying a thickness forming each layer, a time and a temperature for the thermal annealing, an atmosphere gas and the like.

Enthalpy energy (KJ/mole of atoms) of the material forming the first metal layer and the material forming the second metal layer, and oxygen is expressed as follows. That is, Pd, Ir, Zn and Ni are metals in which oxide formation is so easy, and whose enthalpy energy represents values of Pd—O—(−56), Ni—O (−120), Ir—O (−80), Zn—O (−174).

Further, Au and Pt are metals in which oxide formation is so difficult, and whose enthalpy energy represents value of Au—O (−10), Pt—O (+value).

Additionally, the third metal layer is, as described above, selected from the metals forming the first electrode layer and the metal that can easily form the mixed oxide layer.

In case that, among the above materials, Ir is deposited as the first electrode layer on the P—(In, Al) GaN layer, and Au is deposited as the second electrode layer on the first electrode layer, and then ZnO is deposited as the third electrode layer and the thermal annealing is perform at 550° C. in the oxygen atmosphere, the following layer is formed.

P—(In,Al)GaN/P$^+$—(In,Al)GaN/IrO:H/Ir—ZnO (Au exists in the metal dot shape within the oxide)

Herein, since IrO:H has a large metal work function value relatively to Ir (Ir=4.7 eV, IrO:H≥5.4 eV), the P-type ohmic formation can be much helped.

Further, the thermal/structural stability is obtained at the moment of generating the oxide, and the oxide generally has a polycrystalline structure while having an epitaxial relation with GaN.

Accordingly, the Ir—ZnO mixed oxide layer formed at a top portion is helped to have the same heteroepitaxial relation.

This helps that the photon generated from within the light device can be well emitted out of the device. Together with this, since the stable electrode interface can be formed, a reliability of the electrode can be much improved.

Hereinafter, a concrete example of a forming procedure of the ohmic electrode of the P-type gallium nitride-based compound semiconductor (P—(Al)$_x$(In)$_y$(Ga)$_{1-(X+Y)}$N) according to the present invention will be described.

First Ohmic Electrode Forming Method

The P-type gallium nitride-based compound (P—(Al)$_x$(In)$_y$(Ga)$_{1-(X+Y)}$N) semiconductor is surface-washed using trichloroethylene (TCE), acetone, methanol, and distilled water in an ultrasonic washer at a 60° C. temperature by five minutes. Additionally, in order to remove the native oxide layer within the P-type gallium nitride-based compound (P—(Al)$_x$(In)$_y$(Ga)$_{1-(X+Y)}$N) semiconductor, a surface-treatment is performed for ten minutes in a boiling method using the BOE being a fluorine-based wet solution to remove the native oxide layer.

After that, platinum (Pt) and titanium (Ti) being the metal having the excellent reactivity with hydrogen are separately deposited as the contact layer using an electron beam deposition device.

Figure 16:
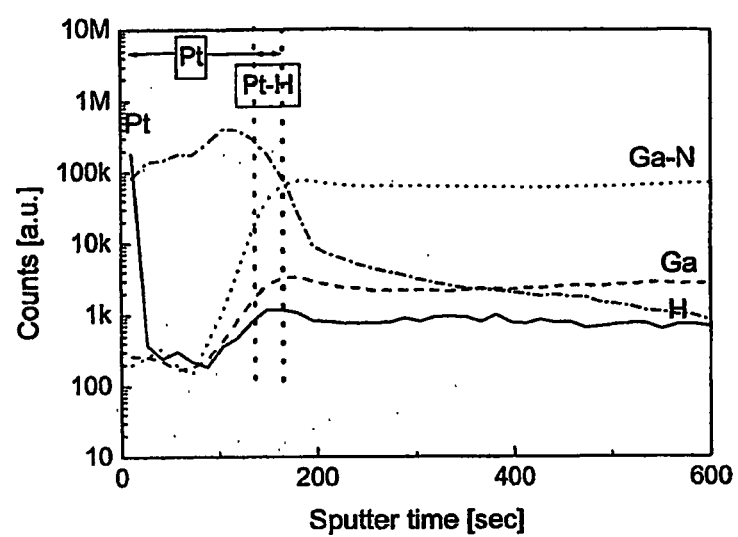
FIG. 16 is a graph illustrating a result of a SIMS depth analysis so as to confirm a platinum-hydrogen compound layer by a first ohmic electrode forming method of a light emitting device according to a preferred embodiment of the present invention.
Figure 17:
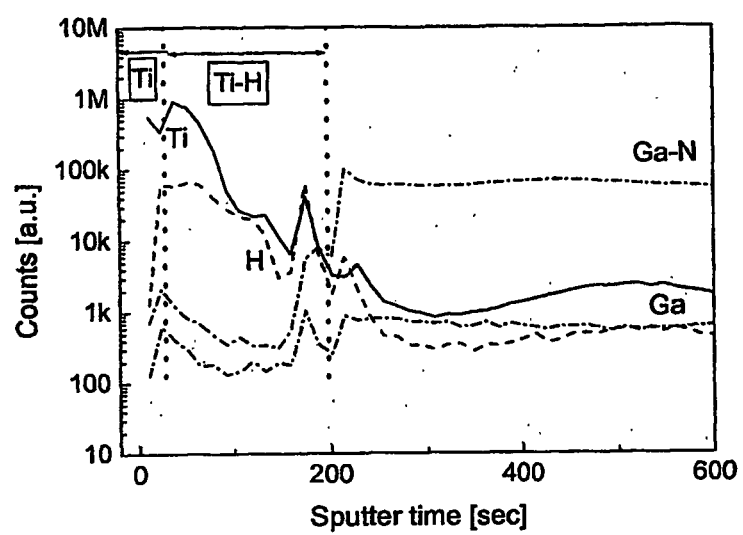
FIG. 17 is a graph illustrating a result of a SIMS depth analysis so as to confirm a titanium-hydrogen compound layer by a first ohmic electrode forming method of a light emitting device according to a preferred embodiment of the present invention.

FIGS. 16 and 17 are graphs illustrating results of SIMS depth analyses so as to confirm a platinum-hydrogen compound layer and a titanium-hydrogen compound layer by the first ohmic electrode forming method of the light emitting device according to a preferred embodiment of the present invention.

Second Ohmic Electrode Forming Method

After the native oxide layer within the P-type gallium nitride-based compound (P—(Al)$_x$(In)$_y$(Ga)$_{1-(X+Y)}$N) semiconductor is removed in the same method as the first ohmic electrode forming method, a circular-transmission line model (C-TLM) pattern is formed using a lithography, and then metal deposition is performed. In the deposition, platinum (Pt) is deposited as the contact layer to have a 20 nm thickness at a pressure of about 10-7 torr, and Gold (Au) having the low reactivity with oxygen is deposited as the bonding pad layer to have a 20 nm thickness. After that, a lift-off process is performed with acetone such that the ohmic electrode having a TLM (Transmission Line Model) pattern is manufactured.

Figure 18:
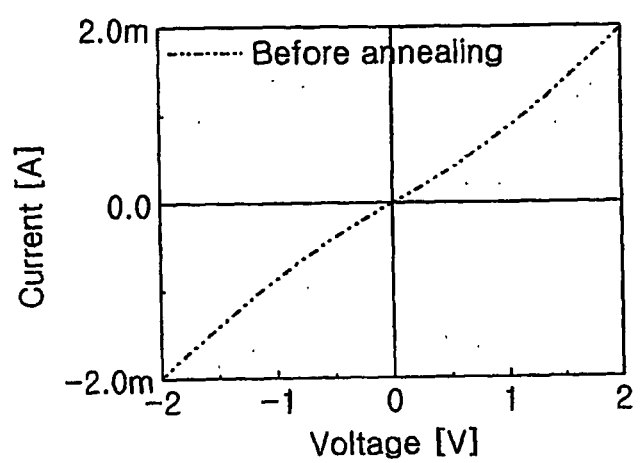
FIG. 18 is a view illustrating a current-voltage characteristic of an ohmic electrode manufactured by a second ohmic electrode forming method of a light emitting device according to a preferred embodiment of the present invention.

FIG. 18 is a view illustrating a current-voltage characteristic of the ohmic electrode manufactured by the second ohmic electrode forming method of the light emitting device according to a preferred embodiment of the present invention.

Third Ohmic Electrode Forming Method

After the second ohmic electrode forming method is all completed, the thermal annealing is performed at a 600° C. temperature in a nitrogen, air, oxygen or argon atmosphere in a furnace for one minute so as to find an ohmic condition.

Figure 19:
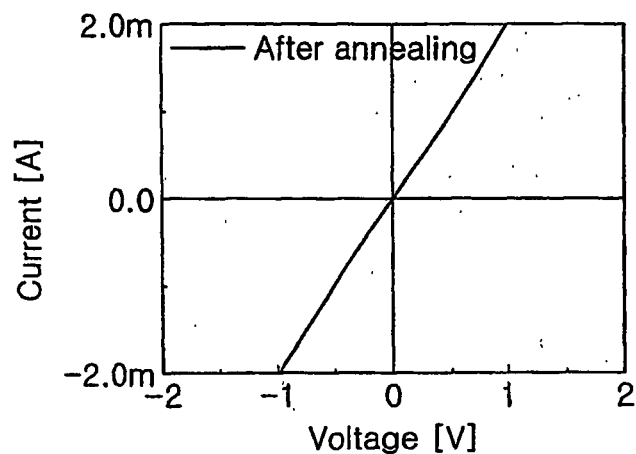
FIG. 19 is a view illustrating a current-voltage characteristic of an ohmic electrode in which a thermal annealing is performed by a third ohmic electrode forming method of a light emitting device according to a preferred embodiment of the present invention.
Figure 20:
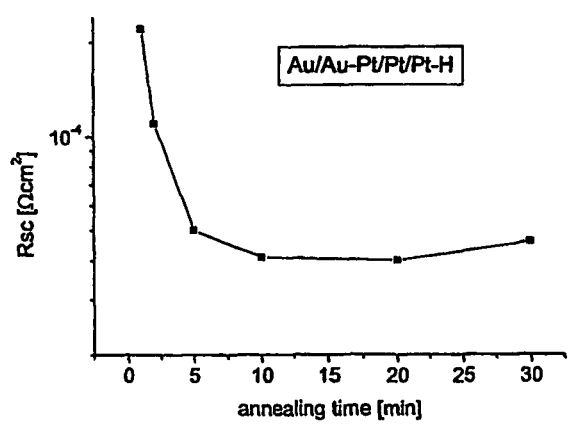
FIG. 20 is a view illustrating a result of a specific contact resistance depending on lapse of a thermal annealing time in a third ohmic electrode forming method of a light emitting device according to a preferred embodiment of the present invention.

FIG. 19 is a view illustrating a current-voltage characteristic of the ohmic electrode in which the thermal annealing is performed by the third ohmic electrode forming method of the light emitting device, and FIG. 20 is a view illustrating a result of a specific contact resistance depending on lapse of a thermal annealing time in the third ohmic electrode forming method of the light emitting-device.

Referring to FIGS. 19 and 20, it can be appreciated that the excellent ohmic contact characteristic is obtained by the above procedure. Specifically, it can be appreciated that the specific contact resistance value reaches less than $10^{-5}$ $\Omega cm^2$.

Fourth Ohmic Electrode Forming Method

The fourth ohmic electrode forming method is almost the same as the second ohmic electrode forming method, however it is differentiated only in that titanium (Ti) is deposited as the contact layer instead of platinum (Pt).

Figure 21:
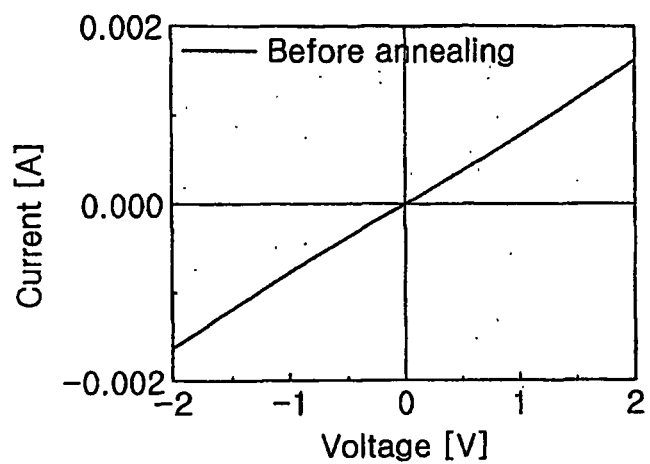
FIG. 21 is a view illustrating a current-voltage characteristic of an ohmic electrode manufactured by a fourth ohmic electrode forming method of a light emitting device according to a preferred embodiment of the present invention.

FIG. 21 is a view illustrating a current-voltage characteristic of an ohmic electrode manufactured by a fourth ohmic electrode forming method of a light emitting-device.

Fifth Ohmic Electrode Forming Method

In order to find the ohmic condition after the fourth ohmic electrode forming process is all completed, the fifth ohmic electrode forming method performs the thermal annealing at a 600° C. temperature for one minute in the nitrogen, air, oxygen or argon atmosphere in the furnace.

Figure 22:
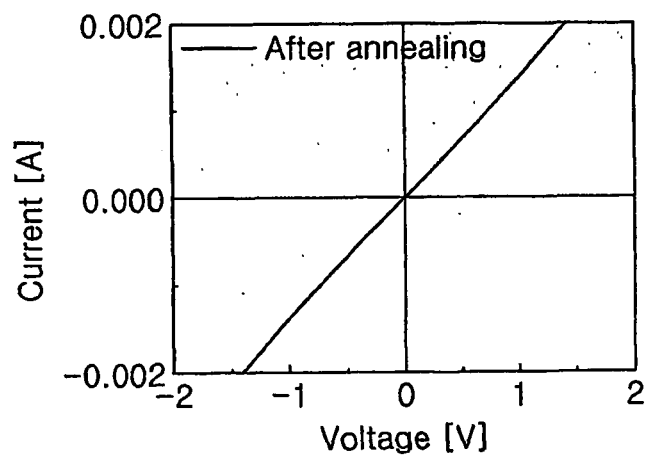
FIG. 22 is a view illustrating a current-voltage characteristic of an ohmic electrode in which a thermal annealing is performed by a fifth ohmic electrode forming method of a light emitting device according to a preferred embodiment of the present invention.
Figure 23:
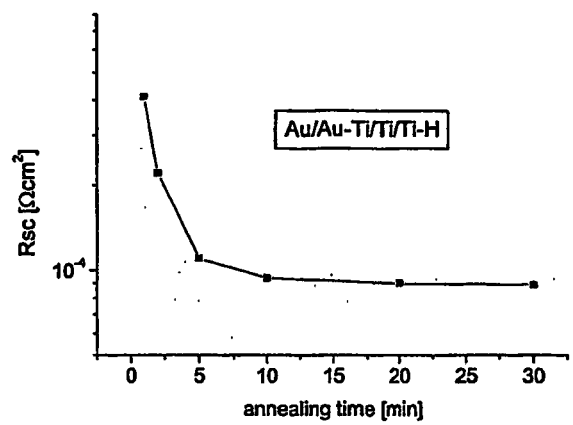
FIG. 23 is a view illustrating a result of a specific contact resistance depending on lapse of a thermal annealing time in a fifth ohmic electrode forming method of a light emitting device according to a preferred embodiment of the present invention.

FIG. 22 is a view illustrating a current-voltage characteristic of an ohmic electrode in which a thermal annealing is performed by the fifth ohmic electrode forming method, and FIG. 23 is a view illustrating a result of a specific contact resistance depending on lapse of a thermal annealing time in the fifth ohmic electrode forming method.

Referring to FIGS. 22 and 23, it can be appreciated that the excellent ohmic contact characteristic is obtained by the above procedure.

Hereinafter, a surface resistance value of the ohmic electrode within a spirit according to the present invention and a conventional surface resistance value are compared to each other for description.

Figure 24:
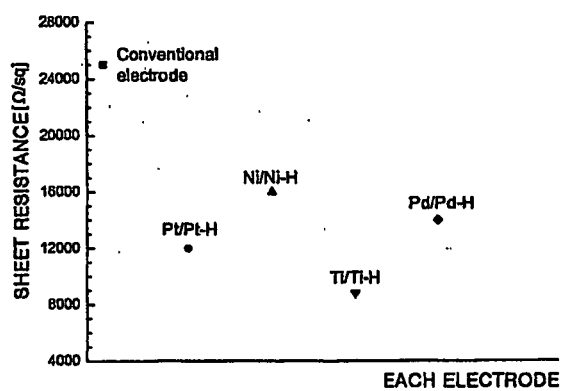
FIG. 24 is a view illustrating a variation of a surface resistance value of an ohmic electrode according to a preferred embodiment of the present invention.

FIG. 24 is a view illustrating a variation of the surface resistance value of the ohmic electrode according to a preferred embodiment of the present invention.

Referring to FIG. 24, it can be appreciated that the carrier concentration within the P-type gallium nitride-based compound (P—$(Al)_x(In)_y(Ga)_{1-(x+y)}N$) semiconductor is caused by formation of the metal hydrogen compound layer.

For example, comparing to the surface resistance value of the conventional ohmic electrode in which the native oxide layer is removed and the metal-hydrogen compound layer is not formed, a lower surface resistance value is observed in the ohmic electrode having the metal-hydrogen compound layer according to the present invention.

The drawings show the variations of the surface resistance values of the times when the platinum-hydrogen compound and the titanium-hydrogen compound are not only formed in the method proposed by the embodiments, but also the nickel-hydrogen compound and the palladium-hydrogen compound are formed in the same condition.

Figure 25:
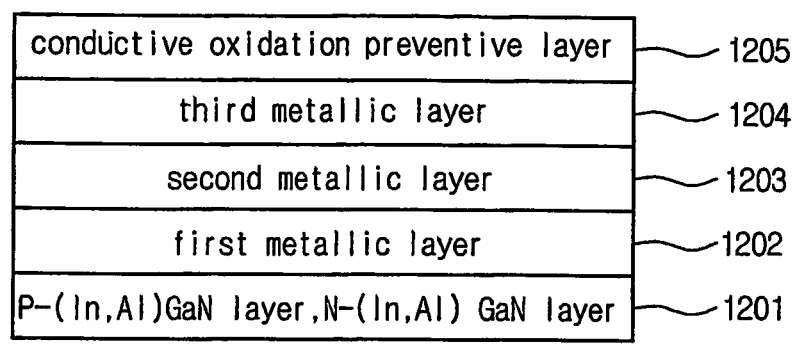
FIG. 25 is a view for depicting an electrode fabrication method of a light emitting device according to another embodiment of the present invention.

FIG. 25 is a view for depicting an electrode fabrication method of a light emitting device according to another embodiment of the present invention.

Herein, it is characterized in that the P-type electrode and the N-type electrode are not only formed separately, but also the P-type electrode and the N-type electrode are formed together in the same process.

First, described will be the process in which the 'open' electrode structured P-type electrode as shown in FIG. 6 and the N-type electrode as shown in FIG. 14 are formed at the same time.

As shown in FIG. 25, a first metal layer 1202 is formed on a P—(In, Al) GaN layer and a N—(In, Al) GaN layer 1201. Herein, the P—(In, Al) GaN layer 1201 is a region in which the P-type electrode is formed, and the N—(In, Al) GaN layer 1201 represents a region in which the N-type electrode is formed.

Additionally, a second metal layer 1203 formed of Al-based material is formed on the first metallic layer 1202.

Further, a third metal layer 1204 is formed on the second metal layer 1203, and a conductive oxidation preventive layer 1205 is additionally formed on the third metal layer 1204.

Herein, the material forming the first metal layer 1202 is of a metal or compound having a high reactivity with Ga and N. Additionally, the material forming the third metal layer 1204 is of a metal or compound having a high reactivity with Al, and is of a metal or compound not having the reactivity with the material forming the conductive oxidation preventive layer 1205.

Hereinafter, the thermal annealing is performed for the resultant material of the preceding step such that the P-type electrode and the N-type electrode of the light emitting device proposed in the present invention can be formed at the same time.

If so, each layer formed through the thermal annealing procedure will be described concretely.

Through the thermal annealing procedure, upper portions of the P—(In, Al) GaN layer (referring to 401 of FIG. 6) and the N—(In, Al) GaN layer (referring to 1001 of FIG. 14) are respectively formed of the P$^+$—(In, Al) GaN layer 402 and the N$^+$—(In, Al) GaN layer 1002.

Additionally, the first metal-Ga compound layer 403 is formed on the P$^+$—(In, Al) GaN layer 402, and the first metal-Ga—N compound layer 1003 is formed on the N$^+$—(In, Al) GaN layer 1002.

Further, the first metal layers 404 and 1004 are formed on the first metal-Ga compound layer 403 and the first metal-Ga—N compound layer 1003, and the third metal-Al compound layer 405 and 1005 on the first metal layers 404 and 1004. Additionally, the conductive oxidation preventive layers 406 and 1006 are provided on the third metal-Al compound layers 405 and 1005.

On the other hand, the first metal layer 1202 shown in FIG. 25 is a layer forming a diffusion barrier introduced so as to suppress an interfacial reaction of the upper metallic elements of the first metal layer 1202 and the P—(In, Al) GaN layer 1201 in the P-type electrode, at the time of the thermal annealing process performed so as to form the ohmic characteristic. Additionally, the first metal layer 1202 has an excellent reactivity characteristic with Ga and N in the N-type electrode, and since this causes the (first metal)-(Ga)—N compound layer 1003 to be formed at the interface, the contact characteristic with the electrode layer is excellent.

The P-type electrode and the N-type electrode formed on basis of the above basic concepts have the following structural variations occurring through the thermal annealing procedure.

First, the material forming the first metal layer 1202 reacts with Ga of the P—(In, Al) GaN layer 1201 to be converted into a dual layer of the first metal-Ga compound layer 403/the first metal layer 404. Herein, the formed dual layer functions as a first diffusion barrier for suppressing the mutual reactivity with the semiconductor and the upper electrode material after the second metal layer 1203.

At the same time, the P—(In, Al) GaN layer 1201 is converted into the P—(In, Al) GaN layer 401/the P$^+$—(In, Al) GaN layer 402. The above structural conversion is accomplished because Ga vacancy formed in the P—(In, Al) GaN layer 401 due to formation of the first metal-Ga compound layer 403 functions as an acceptor in the P-type nitride semiconductor.

At the same time, an N—(In, Al) GaN nitrogen vacancy causes formation of the first metal-Ga—N compound layer 1003 to thereby increase the carrier concentration near the surface such that the converted N—(In, Al) GaN layer 1001/N$^+$—(In, Al) GaN layer 1002 structure is obtained.

Further, Al being the material forming the second metal layer 1203 reacts with the third metal being the material forming the third metal layer 1204 such that the third metal-Al compound layers 405 and 1005 are formed. Additionally, the third metal-Al compound layers 405 and 1005 take charge of a function as a second diffusion barrier for suppressing a unwanted reaction of the material forming the conductive oxidation preventive layer 1205 and the lower electrode and the semiconductor, and finally function to increase the thermal stability of the electrode.

The material forming the conductive oxidation preventive layer 1205 prevents a contaminant material such as oxygen, water and the like easily generated in the thermal annealing and other subsequent processes from intruding into the electrode.

Additionally, the conductive oxidation preventive layer 1205 is of a high conductive material such that the carrier is well introduced into the electrode from the external, and accordingly, is of a material functioning to increase the thermal/chemical stability of an electrode surface.

In the meantime, each metal layer described above can be of the following material.
  first metal layer: Cr, V or W
  second metal layer: Al or Ni—Al
  third metal layer: Ni, Pt or Pd
  conductive oxidation preventive layer: Au or a multi-metal or compound layer of two or more kinds containing Au Herein, Cr, V, W forming the first metal layer has the excellent reactivity with Ga in the P—GaN layer, and has the excellent reactivity with N in the N—GaN layer. As such, the reason why the same metal reacts differently from each other in the P—GaN layer and the N—GaN layer is due to a difference between electronegativity and interfacial energy formed at a metal-semiconductor interface.

That is, the Cr, V, W metals are all materials having the reactivity with Ga and N. At this time, the reacted materials are differentiated due to the above reason such that the reactant results are different in the P—GaN layer and the N—GaN layer.

A 'Heat Formation Enthalpy Energy' representing reactivity of each material is as follows.
  P-Type Electrode
  Cr—Ga: −20 to −30 KJ/mole of atoms
  V—Ga: −67 KJ/mole of atoms
  W—Ga: −1 KJ/mole of atoms
  N-Type Electrode
  Cr—(Ga)—N: −35 KJ/mole of atoms
  V—(Ga)—N: −40 KJ/mole of atoms
  W—(Ga)—N: −24 KJ/mole of atoms Further, a diffusion barrier containing Al has a structure in which it can be earlier formed at the time of a room temperature deposition [the reason is NiAl(−38 KJ/mole of atoms at 298K), PtAl (−100 KJ/mole of atoms at 298K), PdAl (−84 KJ/mole of atoms at 373K)], and through the thermal annealing, more perfect metal-Al compound is formed.

For example, if Cr, Al, Ni, Au are sequentially deposited on a semiconductor structure constructing the light emitting device by using an electron-beam evaporator, a Cr/Al/Ni/Au structure is obtained at the room temperature, and the thermal annealing is performed at 520° C. in a nitrogen-containing atmosphere gas such that the electrode structure proposed in the present invention can be formed.

Meanwhile, since the process of simultaneously forming the 'open' electrode structured P-type electrode as shown in FIG. 7 and the N-type electrode as shown in FIG. 14 is similar with the above descriptions, a detailed description is omitted.

However, in order to form the 'close' electrode structured P-type electrode, the P-type transparent electrode layer (referring to 410 of FIG. 7) is additionally formed between the P—(In, Al) GaN layer 1201 and the first metal layer 1202. That is, after the P-type transparent electrode layer 410 is formed on the P—(In, Al) GaN layer 1201, the first metal layer 1202, the second metal layer 1203, the third metal layer 1204 and the conductive oxidation preventive layer 1205 are laminated and then thermally annealed.

Further, the electrode structure proposed in the present invention can be not only applied to an NP-type light emitting device and an NPN-type light emitting device, but also can be applied directly to other electronic devices, an optic electronic device and the like using the (In, Al) GaN semiconductor.

In detail, in a unipolar n-channel device (HEMT, MISFET, MESFET and the like), the electrode proposed in the present invention can be applied as a source and drain electrode, and in a P-channel device, can be applied as a gate electrode.

Further, even in case a bipolar device, a direct application can be made to emitter, base, collector electrodes depending on an NPN or PNP structure. Furthermore, an application can be made as an ohmic or Schottky electrode even to an electrode of a photo detector.

The present invention can embody a concurrent type ohmic electrode for simultaneously satisfying the P-type ohmic electrode and N-type ohmic electrode characteristics through one electrode structure, differently from the method in which the separated N-type and P-type electrodes applied to the conventional light emitting device are formed.

Further, in the present invention, the thermal/structural stability of the electrode can be much improved in comparison with the conventional electrode due to the stability of the 'first metal-Ga compound layer 403/first metal layer 404' of the P-type electrode and 'first metal-Ga—N compound layer 1003' of the N-type electrode being the first diffusion barrier described above, and 'third metal-Al compound layers 405 and 1005' and 'conductive oxidation preventive layers 406 and 1006' being the second diffusion barrier.

Furthermore, the electrode having the excellent electric/thermal/structural characteristic helps to improve the reliability of the light emitting device, and this can much increase a device life-time.

Additionally, since the present invention has an effect of increasing an actual current density of the device injected, a turn-on voltage reduction of the device can be effectively caused to thereby reduce a device consumption power.

INDUSTRIAL APPLICABILITY

As described above, the light device and the fabrication method thereof according to the present invention has an advantage in that an electric/thermal/structural stability is obtained, and the P-type electrode and the N-type electrode can be simultaneously formed.

Further, the present invention has an advantage in that the P-type electrode and the N-type electrode can be simultaneously formed to thereby simplify a manufacture process, and reduce a cost.

Furthermore, the specific contact resistance within the transparent electrode is lowered, and the carrier supplied from the external performs the regular current spreading into the device using the lowered resistance.

Additionally, the photon generated and emitted from within the device can be allowed to well escape to the external.

Further, the metal-hydrogen compound layer is formed within the ohmic electrode such that the excellent ohmic electrode of the P-type gallium nitride-based compound (P—(Al)$_x$(In)$_y$(Ga)$_{1-(x+y)}$N) can be embodied.

In the embodiments of the present invention, the electrode structure of the light emitting device and its fabrication method are described, but they can be not only applied to the light emitting device, but also can be applied directly to the other devices, the optic electronic device and the like using the (In, Al) GaN semiconductor.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A light emitting device, comprising:
an n-type conductive semiconductor layer;
an active layer formed on the n-type conductive semiconductor layer;
a p-type conductive semiconductor layer formed on the active layer and having a Ga vacancy;
a high concentration p-type GaN-based semiconductor layer configured to directly contact the p-type conductive semiconductor layer;
a first metal-Ga compound layer functioning as a first diffusion barrier;
a first metal layer formed on the first metal-Ga compound layer;
a third metal-Al compound layer configured to directly contact the first metal layer and functioning as a second diffusion barrier, the third metal being one selected from the group consisting of Ni, Pt and Pd; and
a conductive oxidation preventive layer formed on the third metal-Al compound layer,
wherein the high concentration p-type GaN-based semiconductor layer has a higher concentration of Ga material than the p-type conductive semiconductor layer,
wherein the high concentration p-type GaN-based semiconductor layer comprises a carrier concentration higher than a carrier concentration of the p-type conductive semiconductor layer,
wherein the first metal-Ga compound layer is disposed between the first metal layer and the high concentration p-type GaN-based semiconductor layer,
wherein the third metal-Al compound layer contacts both a top surface of the first metal layer and a bottom surface of the conductive oxidation preventive layer, and
wherein the first metal-Ga compound layer comprises a compound material of the p-type conductive semiconductor layer and a metal material of the first metal layer.

2. The light emitting device according to claim 1, wherein the third metal is of a metal or compound having a high reactivity with Al.

3. The light emitting device according to claim 1, wherein the conductive oxidation preventive layer is of Au, or is of a multi-metal or compound of two or more kinds containing Au.

4. The light emitting device according to claim 1, wherein the first metal-Ga compound layer, the first metal layer, the third metal-Al compound layer, and the conductive oxidation preventive layer form an electrode.

5. The light emitting device according to claim 1, wherein the n-type conductive semiconductor layer comprises at least one of an Al material or an In material.

6. The light emitting device according to claim 1, wherein the conductive oxidation preventive layer comprises one of Au, a multi-metal, and a compound of two or more kinds containing Au.

7. The light emitting device according to claim 1, wherein the third metal-Al compound layer is a metal layer.

8. The light emitting device according to claim 1, wherein the high concentration p-type GaN-based semiconductor layer comprises a carrier concentration of more than $10^{18}$ cm$^{-3}$.

9. The light emitting device according to claim 1, wherein high concentration the p-type GaN-based semiconductor layer and the first metal-Ga compound layer are formed using the p-type conductive semiconductor layer and the first metal layer.

10. The light emitting device according to claim 1, wherein the first metal layer comprises W.

11. The light emitting device according to claim 1, wherein the first metal-Ga compound layer is directly disposed on the high concentration p-type GaN-based semiconductor layer.

12. The light emitting device according to claim 1, wherein a lateral width of the high concentration p-type GaN-based semiconductor layer is substantially the same with a lateral width of the first metal layer.

13. The light emitting device according to claim 1, wherein a lateral width of the high concentration p-type GaN-based semiconductor layer is substantially the same with a lateral width of the first metal-Ga compound layer.

* * * * *